(12) United States Patent
Hart et al.

(10) Patent No.: US 8,597,448 B2
(45) Date of Patent: Dec. 3, 2013

(54) ELECTROSTATIC CHUCKS AND METHODS FOR REFURBISHING SAME

(75) Inventors: Alisa Hart, Boulder Creek, CA (US); John C. Boyd, Crawford, TX (US); Liza Palma, Manteca, CA (US); Alasdair Dent, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 900 days.

(21) Appl. No.: 12/648,638

(22) Filed: Dec. 29, 2009

(65) Prior Publication Data

US 2011/0155299 A1    Jun. 30, 2011

(51) Int. Cl.
*B32B 38/10* (2006.01)

(52) U.S. Cl.
USPC .............................................. 156/98; 156/230

(58) Field of Classification Search
USPC .................................................. 156/98, 230
See application file for complete search history.

(56) References Cited

U.S. PATENT DOCUMENTS

| 3,513,891 | A | * | 5/1970 | Heth | 144/209.1 |
| 5,581,874 | A | * | 12/1996 | Aoki et al. | 29/825 |
| 7,019,956 | B2 | * | 3/2006 | Fujii et al. | 361/234 |
| 7,558,045 | B1 | | 7/2009 | Onate et al. | |
| 2005/0219786 | A1 | | 10/2005 | Brown et al. | |
| 2006/0002053 | A1 | | 1/2006 | Brown et al. | |
| 2007/0190799 | A1 | | 8/2007 | Wang et al. | |
| 2008/0089001 | A1 | * | 4/2008 | Parkhe et al. | 361/234 |
| 2008/0143379 | A1 | * | 6/2008 | Norman | 326/39 |
| 2009/0034149 | A1 | | 2/2009 | Lubowirsky et al. | |

FOREIGN PATENT DOCUMENTS

JP    2005-191500    7/2005
WO   WO 2011/090650   7/2011

OTHER PUBLICATIONS

International Search Report and Written Opinion mailed Sep. 14, 2011, for Application No. PCT/US2010/061348.

* cited by examiner

*Primary Examiner* — Katarzyna Wyrozebski Lee
*Assistant Examiner* — Margaret Squalls
(74) *Attorney, Agent, or Firm* — Weaver Austin Villeneuve & Sampson LLP

(57) ABSTRACT

Novel methods for extending electrostatic chuck lifetimes are provided. The methods involve providing a chuck having a metal cooling plate attached to a ceramic top plate via indium bonding, and after a period of use, disassembling the chuck, and providing a new chuck including the used metal cooling plate. In certain embodiments, the use of indium as a bond material uniquely allows the described disassembly and reassembly without damage to other parts of the chuck.

11 Claims, 8 Drawing Sheets

ELECTROSTATIC CHUCKS AND METHODS FOR REFURBISHING SAME

BACKGROUND

Chucks are employed to support wafers in a variety of semiconductor workpiece processes. In a deposition process, for example, a chuck clamps a semiconductor wafer in place while a film is deposited on the wafer. Similarly, in an etch process, an electrostatic chuck clamps a semiconductor wafer in place while material is removed from the wafer. An electrostatic chuck has electrodes that are energized with a clamping voltage, which electrostatically clamps the wafer to the surface of the electrostatic chuck.

After a wafer is transferred to a processing chamber, it rests on the upper surface of the electrostatic chuck. A clamping voltage is applied to the electrostatic chuck to clamp the wafer during the process. Uniformity in the chuck surface is critical to deposition or etch uniformity across the wafer surface. Over a period of use, uneven wear on the chuck can lead to poor uniformity across a wafer, as well as poor wafer-to-wafer uniformity.

SUMMARY

Novel methods for extending electrostatic chuck lifetimes are provided. The methods involve providing a chuck having a metal cooling plate attached to a ceramic top plate via indium bonding, and after a period of use, disassembling the chuck, and providing a new chuck including the used metal cooling plate. In certain embodiments, the use of indium as a bond material uniquely allows the described disassembly and reassembly without damage to other parts of the chuck.

These and other aspects are described further below.

DETAILED DESCRIPTION

Novel methods for extending electrostatic chuck lifetimes are provided. In certain embodiments, the methods involve receiving a chuck including a metal bottom plate bonded to a ceramic top plate. The metal bottom plate may be a cooling plate including one or more channels for coolant. The ceramic plate typically includes electrodes and a top surface on which a wafer is clamped via electrostatic force during processing.

In certain embodiments, the methods involve providing a chuck having a metal cooling plate attached to a ceramic top plate via indium bonding, and after a period of use, disassembling the chuck, and providing a new chuck including the used metal cooling plate. In certain embodiments, the use of indium as a bond material uniquely allows the described disassembly and reassembly without damage to other parts of the chuck.

Figure 1A:
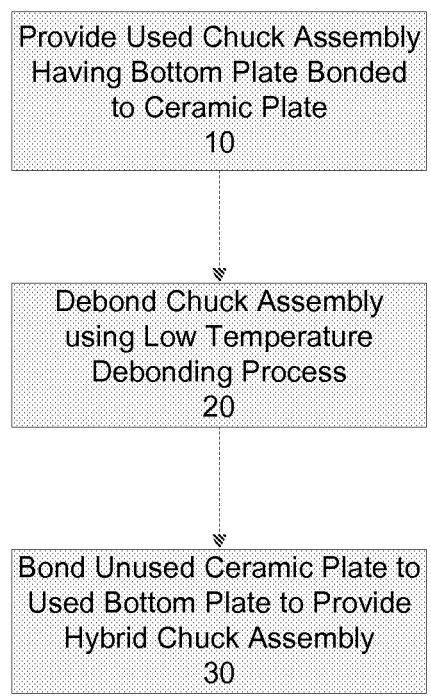
FIG. 1A is a flowchart showing operations in a method of refurbishing an electrostatic chuck according to certain embodiments.

FIG. 1A is a process diagram depicting certain operations in a method of extending electrostatic chuck lifetimes according to certain embodiments. The process begins by providing a used chuck assembly having a bottom plate bonded to a ceramic top plate. (Block 10). A low-temperature debonding process is then performed to separate the top and bottom plates. (Block 20). According to various embodiments, the low temperature process involves exposing the chuck assembly to temperatures no higher than about 250° C. or about 200° C. Using a low temperature debonding process prevents undesirable structural transformation of the metal bottom plate that can occur at higher temperatures. As discussed further below, in certain embodiments, the debonding process raising the chuck assembly temperature to about 156° C. or higher, for example, between about 156° C. and 180° C., to melt an indium bond. Once separated, the bottom plate may be cleaned and bonded to a new ceramic plate, producing a hybrid new-used chuck assembly. (Block 30). Due to the low temperature debonding process, the metal bottom plate is undamaged. In certain embodiments, the low temperature debonding process is performed without requiring any mechanical separation techniques, such as chipping bonding material off, or chemical separation techniques. In other embodiments, the low temperature process may involve fracturing the ceramic plate to remove it from the assembly, and then mechanically chipping off the bonding material and/or applying a chemical etch to remove the bonding material.

Figure 1B:
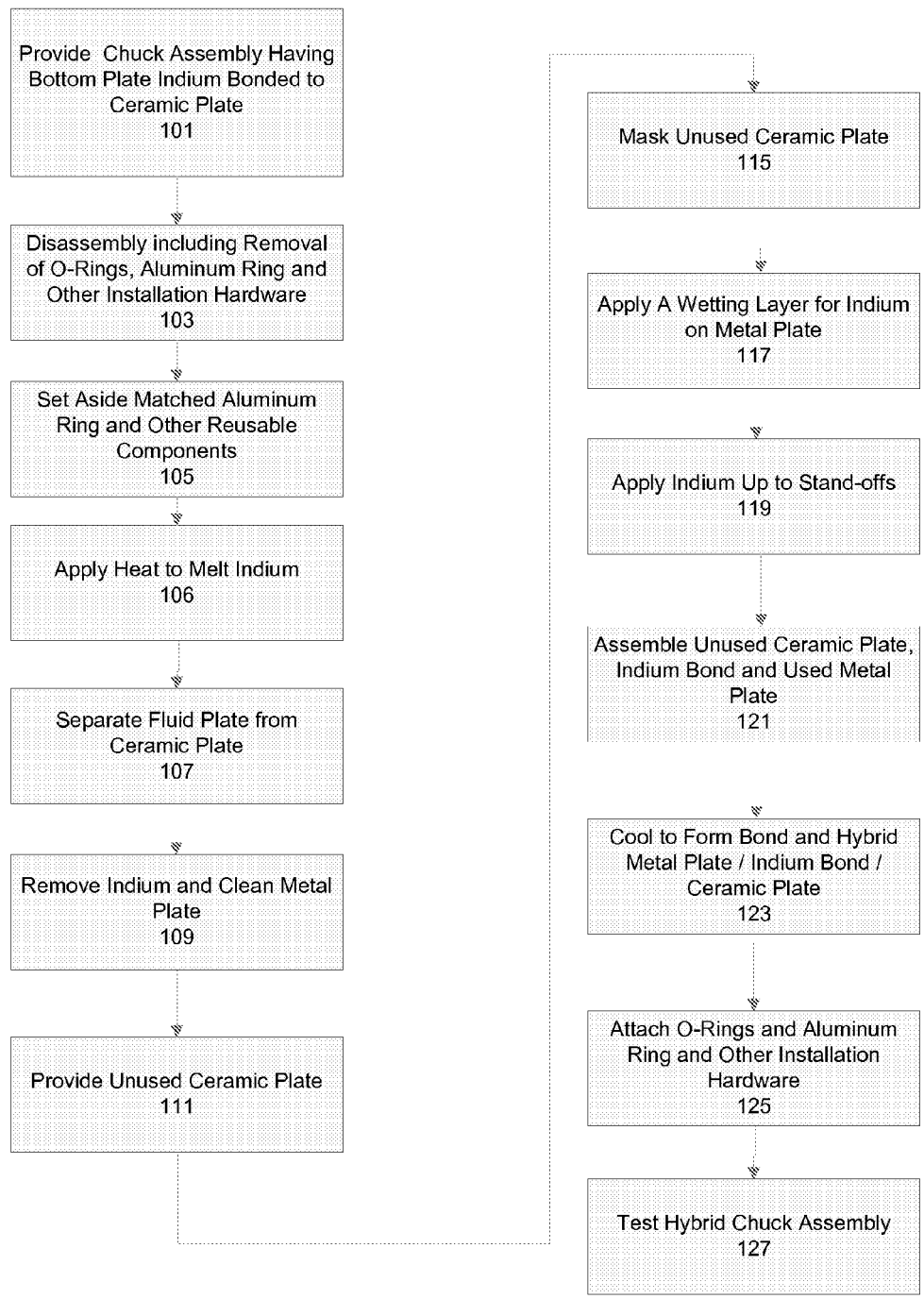
FIG. 1B is a flowchart showing operations in a method of refurbishing an electrostatic chuck according to certain embodiments.

As indicated, in certain embodiments, the debonding process involves heating the bond to melt an indium bond. The use of indium bonding material allows non-fracturing debonding to occur at much lower temperatures than required for other types of bonds including elastomer bonds and aluminum bonds. FIG. 1B is a process diagram depicting certain operations in such a method of extending electrostatic chuck lifetimes according to certain embodiments. The process begins by providing a used electrostatic chuck at or near the end of its useable lifetime for the particular process. (Block 101). For average processes, the electrostatic chuck may have processed anywhere from 5,000 to 80,000 wafers. Depending on the particular process and the process requirements, the chuck may have processed fewer or more wafers. Typical process conditions include temperatures of between about 300° C. and 600° C.

Figure 2:
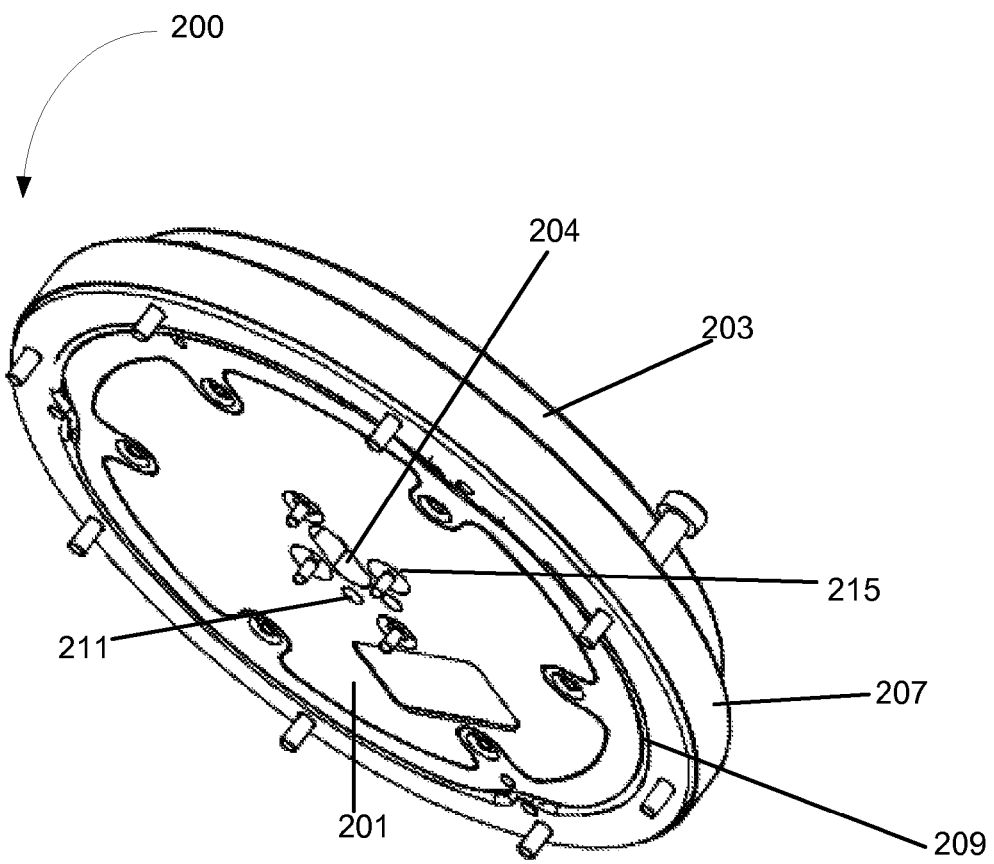
FIG. 2 is an isometric view of a chuck assembly including a top plate and bottom plate.

FIG. 2 is an isometric view of a chuck assembly 200 including bottom plate 201 and top plate 203. In use, a wafer rests on the top surface (not shown) of top plate 203. Top plate 203 is made of a ceramic material and includes an electrode assembly (not shown) to receive a clamping voltage to electrostatically adhere a wafer to the electrostatic chuck 200.

Bottom plate 201 is made of a metal, typically copper though brass or another material may be used, and includes one or more channels 211 through which a coolant, typically water, passes to cool the chuck. Orifice 204 is a backside gas delivery path and may accommodate a sapphire pin (not shown) that extends into a similarly situated orifice (not shown) in the ceramic plate 203. The pin does not extend to the top surface of the ceramic plate 203 and may be used in a substrate temperature measurement system. Pins 215 include RF and DC bias pins. Bottom plate 201 is bonded to ceramic plate 203. The assembly 200 also includes a matched aluminum ring 207 that fits around bottom plate 201. O-ring 209 aids in aligning match aluminum 207 and bottom plate 201.

Returning to FIG. 1B, one or more mechanisms of failure may be associated with the electrostatic chuck at this point. Localized areas of non-uniformity may form on the top surface of plate 203 due to processing uniformities. In many cases, leakage from the bonding material between the bottom plate 201 and top plate 203 results in uneven bonding across the chuck, and as a result, non-uniformity of chuck height. Conventional methods of refurbishing an electrostatic chuck involve machining the surface of plate 203 to remove the localized areas of non-uniformity. However, it has been found that these result in early failure or poor uniformity. It is believed that one cause of this is due the above-described leakage, which is not addressed by conventional refurbishment techniques.

The chuck assembly is then disassembled, by removing the O-rings, the aluminum ring and other installation hardware. (Block 103) The aluminum ring is matched to the bottom plate and is associated with it through the lifetime of the bottom plate. (Block 105).

Figure 3:
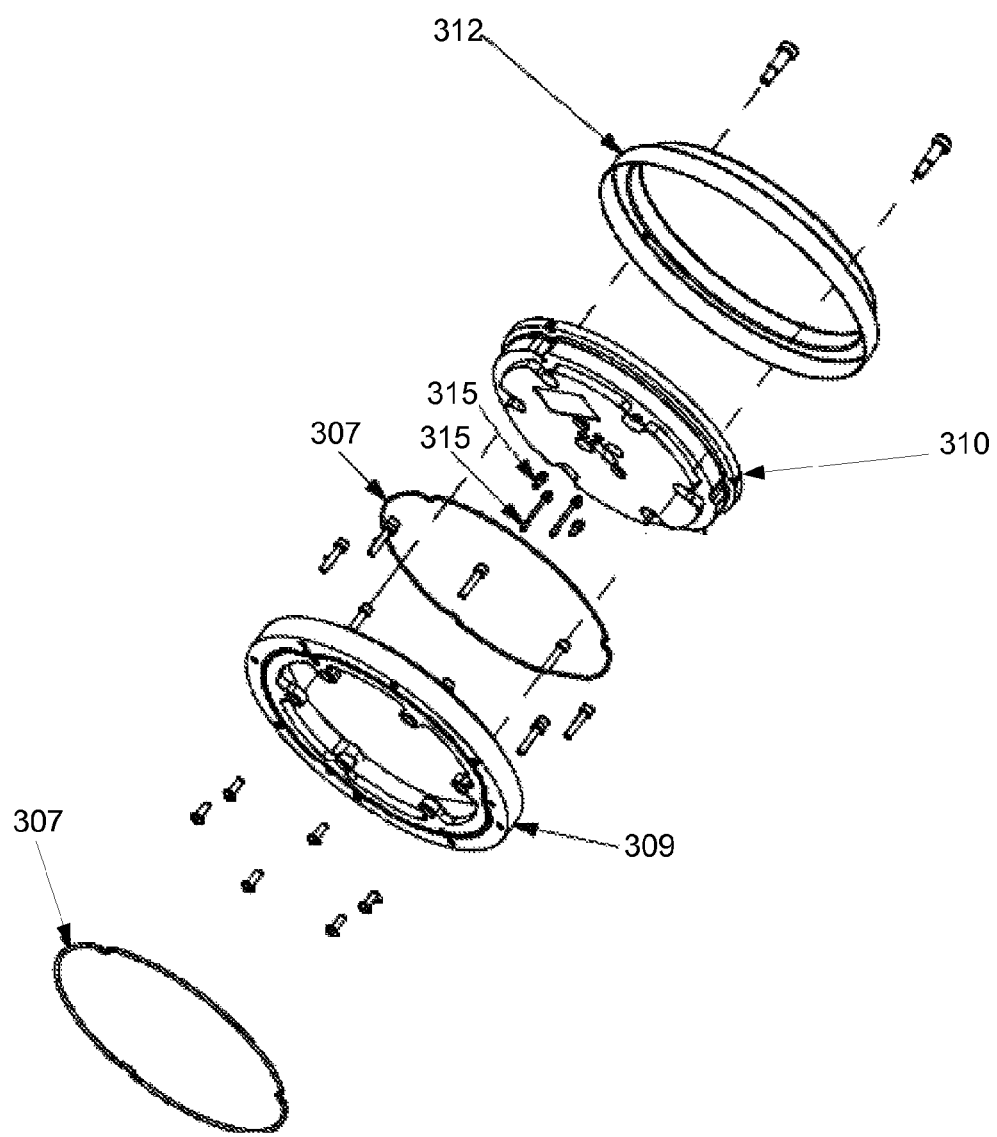
FIG. 3 is an exploded view of various components of the chuck assembly after disassembly.

FIG. 3 shows an exploded view of various components of the chuck assembly after disassembly, including aluminum ring 309, O-rings 307 and bottom/top plate assembly 310. Shipping cover 312 is also shown. In addition to the pins that hold the assembled components together, the assembly includes RF and DC bias pins 315. Returning to FIG. 1, the aluminum ring is set aside along with other parts that may be reuseable, such any pins, connectors, and rings as depicted in FIG. 3 that remain undamaged. As described further below the aluminum ring forms a matched set with the bottom plate and is precisely machined to match the dimensions of stand-offs on the bottom plate that control the height of the bond between the bottom plate and the top plate, and the height of the overall chuck assembly. The matched aluminum ring is set aside for later assembly of the new chuck assembly.

At this stage, the bonded top and bottom plate (310 in FIG. 3) remain. Sufficient heat is then applied to melt the indium. (Block 106). The melting point of indium is about 156° C., low enough that the assembly may be heated without affecting the bottom plate. Elastomer bonds, for example, must be heated to significantly higher temperatures (e.g., 250° C. or higher such as 300° C.) and may require additional physical operations such as chipping the bonding material off the metal plate to remove the bonding material. At these temperatures, the copper plate may undergo annealing, which can misshape the plate beyond its allowable tolerances and lead to process non-uniformities.

Figure 4:
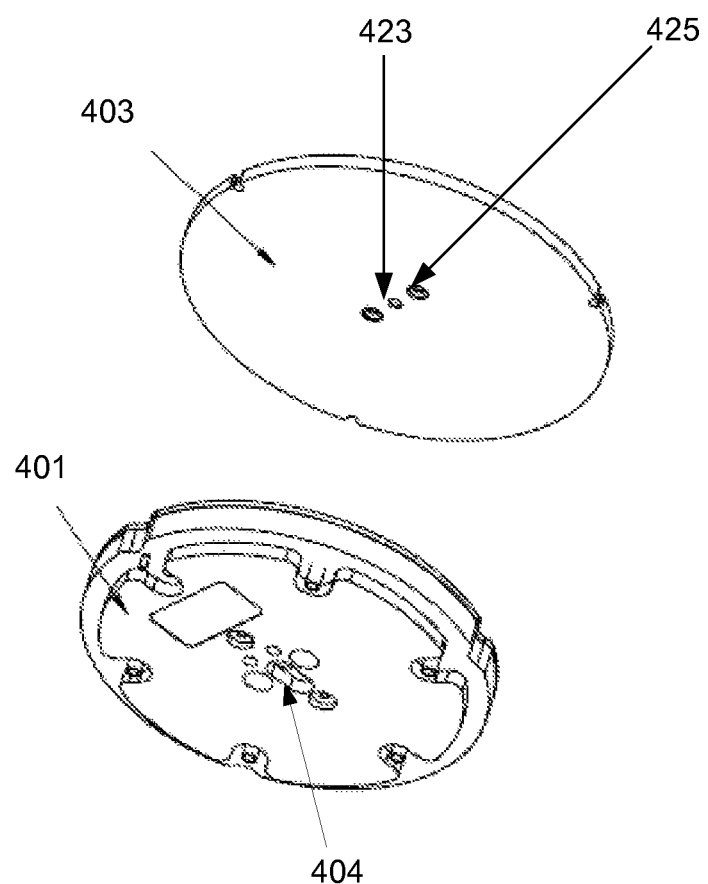
FIG. 4 is isometric views of an unused top plate and used bottom plate.
Figure 5:
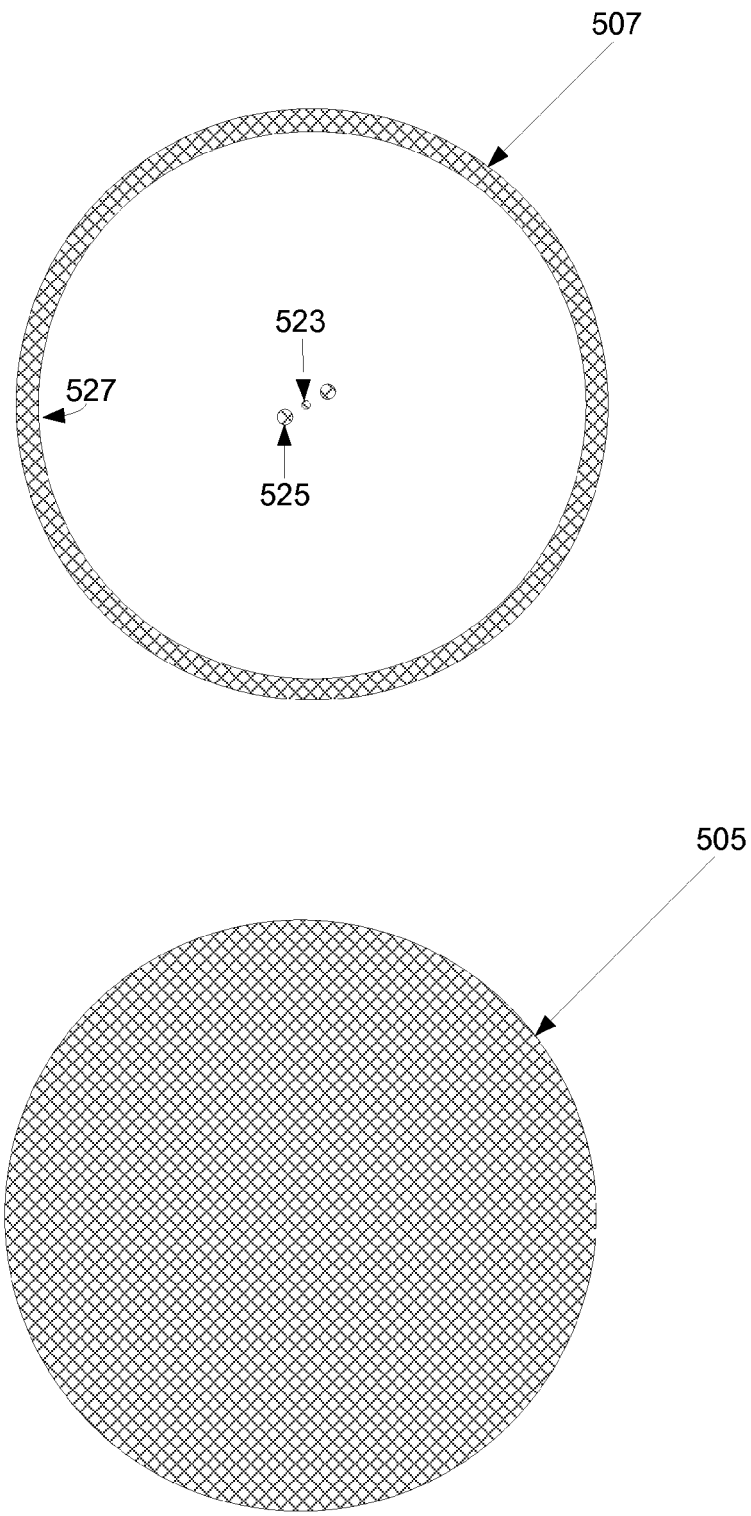
FIG. 5 illustrates masking of the top (wafer-contacting) side and the bottom (bond-contacting) side of a ceramic plate.

After debonding, the ceramic top plate and metal bottom plate are separated. (Block 107). The indium is removed from the metal plate, and the metal plate is cleaned. (Block 109). In other embodiments, the indium is optionally left on the metal plate for use in bonding a new ceramic plate. If removed, the indium may be discarded or saved for reuse in subsequent bonding processes. Unlike other bonding materials, because the indium is liquefied at low temperatures, it can be wiped off or otherwise easily removed without having to remove any remaining solid materials. Cleaning the metal plate is optional. In certain embodiments, the coolant channels are checked for build-up and cleared of any blockages. An unused ceramic plate that has not undergone any semiconductor fabrication processing operations is then provided. (Block 111). FIG. 4 depicts unused ceramic plate 403 and bottom plate 401. Unused ceramic plate 403 includes orifice 423 for backside gas delivery, which aligns with orifice 404 in bottom plate 401. Unused ceramic plate 403 contains orifices 425 for alignment, which align with corresponding orifices on used metal plate 401. The unused ceramic plate is then masked. (Block 115). FIG. 5 shows a schematic of the top (wafer support) side 505 of the ceramic plate and bottom side 507 of the ceramic plate, with black depicting the masked portions of the plate. The entire top side 505 is masked, as are the bottom side orifices 523 and 525, and the side edge (not shown) of the plate. In certain embodiments, an edge region 527 of the bottom side 507 is also masked to prevent any bonding material from extending beyond the bottom plate once the ceramic plate is assembled with the bottom plate and the indium bonding material. According to various embodiments, the width of the edge region 527 may be at least about 0.05 inches, at least about 0.1 inches, or at least about 0.15 inches, or 0.19 inches.

Figure 6:
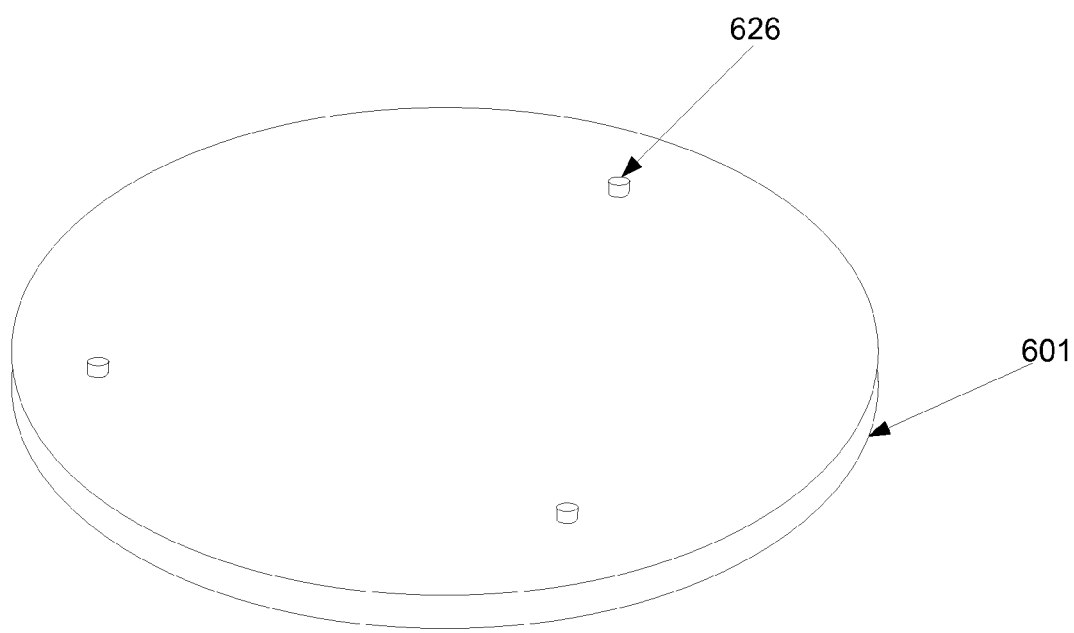
FIG. 6 shows a schematic of a bottom plate including three stand-offs to control bond height.

The metal plate may also be masked as necessary to protect orifices on its top side. A wetting layer is then applied to the metal plate by a PVD, CVD or other appropriate process. (Block 117) According to various embodiments, the wetting layer may be a backside metallization or wetting layer. The wetting layer is applied to the edge of the top surface of the metal plate. Indium is then applied, typically in a paste, to a height of 0.01 inches (10 mils). To do this, this indium is applied up to a height of 0.01 inch high stand-offs on the top side of metal plate. (Block 119). FIG. 6 shows a schematic of a bottom plate 601 including three stand-offs 626. The stand-offs control the thickness of the indium bond. The aluminum ring described above with respect to FIGS. 2 and 3 is matched to the metal plate and stand-offs, typically machined at the same time to fit the stand-offs exactly. Using unmatched pieces results in imprecise fitting and non-uniformity across a wafer.

The bond height of about 10 mils is permissible because of the high thermal conductivity of indium; elastomer bonds, for example, would need to be between about 2 and 4 mils. The indium bonding material is applied to the edge of the metal plate. The unused ceramic plate is then put into contact with the bonding material to assemble the hybrid used/unused chuck assembly. (Block 121) The indium bond is tightly controlled such that it is not recess from or extend past the edge of the metal plate. In certain embodiments, this is facilitated by the use of the mask around the edge region 527 of the bottom surface of the ceramic plate as depicted in FIG. 5.

Figure 7:
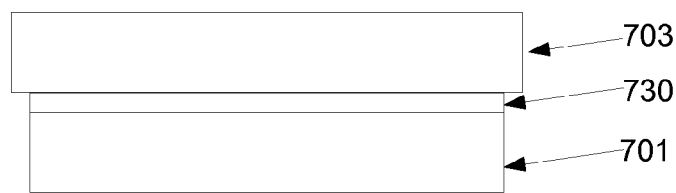
FIG. 7 is a simple schematic showing a cross-section of the refurbished hybrid assembly.

The assembly is then cooled to form the bond, thereby completing the assembly of the hybrid chuck. (Block 123). The masking is then removed. FIG. 7 shows a simple not-to-scale schematic of the hybrid assembly at this juncture, including unused ceramic plate 703, used metal plate 701 and indium bond 730. The indium bond 730 extends to the edge of the metal plate 701, neither recessed from the edge nor extending past it. The edges of the unused ceramic plate 703 extend past the edges of indium bond 725, for example about 0.19 inches. In other embodiments, the ceramic plate may extend to the edge of the indium bond.

In certain embodiments, the height of the depicted assembly is about 1.2-1.3 inches, e.g., 1.25-1.27 inches, with the indium bond being about 0.01 inches thick. In one example, the diameter of the ceramic plate is about 7.794 inches and the diameter of the metal plate 7.424 inches.

Returning to FIG. 3, the O-rings 307 are then put into position and the matched aluminum ring 309 is also put into position. The power pins and other pins are then replaced and the aluminum ring is bolted into position. This is described in block 125 of FIG. 1A. The resulting assembly is as shown in FIG. 2, with an unused ceramic plate. The bolts of the aluminum ring exert pressure on the metal plate away from the ceramic plate, with the indium bond holding the ceramic and metal plates together against this force. The indium bond also absorbs much of the stress placed on the assembly in this manner. The assembly is then tested. (Block 127).

Figure 8:
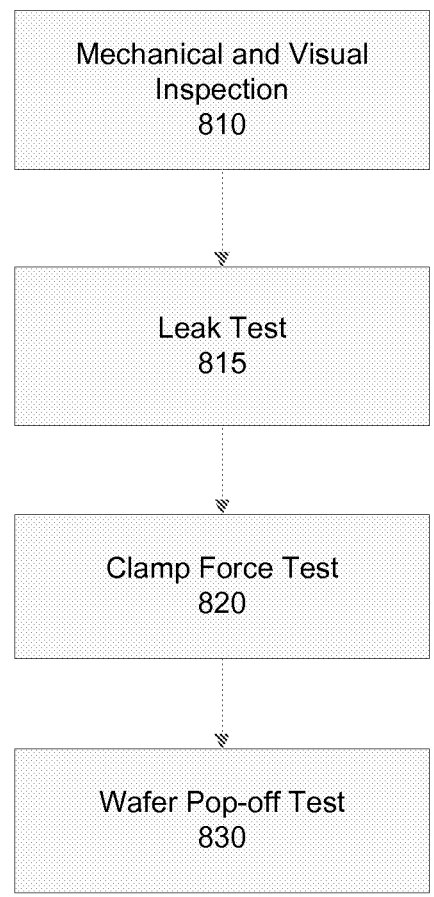
FIG. 8 is a flowchart showing operations in a method of testing a hybrid chuck according to certain embodiments.

FIG. 8 is a process diagram depicting certain operations in a method of testing the hybrid electrostatic chuck according to certain embodiments. The chuck is first inspected manually and visually. (Block 810). Visual inspection is performed to note any cracks, chips, scratches or discolorations. Mechanical inspection may include assessing flatness of the wafer support and other surfaces, assessing the parallelism of parallel surfaces, measuring the overall thickness of the chuck and measuring the electrode withstanding voltage. A leak test is then performed. (Block 815). This test involves installing the chuck in a vacuum chamber, and applying a helium flow to the underside of the chuck. A leak checker is employed to check for leaks of the helium to the vacuum chamber. A clamp force test is then applied. (Block 820). This test involves installing the electrostatic chuck in a vacuum chamber, and placing a wafer on the chuck. A DC voltage is applied to clamp the wafer. A gas is applied to the backside of the wafer: if the backside flow changes above a certain amount (e.g., 5 sccm) with the backside gas applied or the wafer is observed to float, this indicates that the clamping force is not strong enough. A wafer pop-off test may then be performed (Block 830). In this test, backside gas is applied with pressure raised until the wafer pops off the chuck.

Other Embodiments

In other embodiments the processes described above are applied to electrostatic chucks having elastomer or aluminum bonds. For example, in certain embodiments, a chuck is provided after a period of use, as described above with respect to FIG. 1. In these embodiments, however, the ceramic plate and metal plate are bonded via an elastomer bond. A high temperature (e.g., above 250° C. or higher) debonding process may be used to separate the ceramic plate and the metal plate in certain embodiments. In other embodiments, the ceramic plate and metal plate are separated by mechanical force, e.g., breaking off the ceramic plate and removing the bonding material by chipping, breaking, etc. In certain embodiments, the debonding process includes both heating and chipping off the bonding material. An unused ceramic plate is then supplied and bonded to the metal plate to create a hybrid chuck assembly as depicted in FIG. 7. Bond thicknesses for the elastomer bond are on the order of a few mils. According to various embodiments, metal plate may or may not include standoffs of this height to form the bond.

In still other embodiments, a chuck including an indium bond may be refurbished to include an elastomer bond. In these embodiments, a used chuck may be provided and undergo a low temperature debonding process as described above. Elastomer bonding material is then used to bond an unused ceramic plate to the used metal plate. If the metal plate includes standoffs to control bond height as described above, the process removing these or machining them down to the appropriate height of the elastomer bond.

While the present invention has been described with reference to preferred embodiments, those skilled in the art will recognize that changes may be made in form and detail without departing from the spirit and scope of the invention.

The invention claimed is:

1. A method for extending the lifetime of an electrostatic chuck, said chuck comprising a metal cooling plate and a first ceramic plate attached to said metal cooling plate, said method comprising:
    performing a low temperature process to remove the first ceramic plate from the metal cooling plate after a period of use, wherein the metal cooling plate comprises a plurality of protrusions extending from a planar portion;
    providing a second ceramic plate, said second ceramic plate being unused;
    applying indium between the second ceramic plate and the metal cooling plate, wherein the indium is applied to the planar portion of the metal cooling plate to the height of the protrusions, said indium being removable by a low-temperature process; and
    solidifying the indium to form an electrostatic chuck comprising the metal cooling plate, the second ceramic plate and bond between the metal cooling plate and the second ceramic plate.

2. The method of claim 1 wherein the performing a low temperature process to remove the first ceramic plate from the metal cooling plate comprises heating the electrostatic chuck to a temperature of less than about 200° C.

3. The method of claim 1 wherein the bonding material is removable by heating the material to a temperature of less than about 200° C.

4. The method of claim 1 wherein the protrusions have a height of about 0.01 inches.

5. The method of claim 1 wherein the bond does not extend past the edges of the metal cooling plate and is not recessed from the edges of the metal cooling plate.

6. A method for refurbishing an electrostatic chuck, said chuck comprising a metal cooling plate having openings therein and a first ceramic plate attached to said metal cooling plate, said method comprising:
    removing an aluminum ring from the metal cooling plate, said aluminum ring being machine-matched to a plurality of protrusions on the metal cooling plate;
    heating the electrostatic chuck to a temperature of less than about 200° C. to remove the first ceramic plate from the metal cooling plate after a period of use;
    providing a second ceramic plate having openings therein, said second ceramic plate being unused;
    aligning the second ceramic plate with metal cooling plate such that the openings within the second ceramic plate align with the openings in the metal cooling plate;
    applying indium bonding material between the metal cooling plate and the second ceramic plate; and
    solidifying the indium bonding material to form an indium bond between the metal cooling plate and the second ceramic plate, wherein the indium bond does not extend past the cooling plate and further wherein the second ceramic plate extends beyond the indium bond;
    re-attaching the aluminum ring to the metal cooling plate.

7. The method of claim 6, further comprising masking the openings in the cooling plate prior to applying the indium bonding material.

8. The method of claim 6 wherein the second ceramic plate comprises a bond-contacting side and a non-bond-contacting side.

9. The method of claim 6 wherein the protrusions have a height of about 0.01 inches.

10. The method of claim 9 wherein applying bonding material comprises applying it to the planar portion of the metal cooling plate to the height of the protrusions.

11. The method of claim 6 further comprising masking an annular ring on the bond-contacting side of the second ceramic plate, said ring extending from the edge of the second ceramic plate to a distance of at least about 0.1 inches from the edge of the second ceramic plate.

* * * * *